US006839289B2

(12) United States Patent
Takahashi

(10) Patent No.: US 6,839,289 B2
(45) Date of Patent: Jan. 4, 2005

(54) SEMICONDUCTOR STORAGE DEVICE

(75) Inventor: Kazuhiko Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 20 days.

(21) Appl. No.: 10/254,996

(22) Filed: Sep. 26, 2002

(65) Prior Publication Data

US 2003/0185059 A1 Oct. 2, 2003

(30) Foreign Application Priority Data

Mar. 27, 2002 (JP) ........................................ 2002-088157

(51) Int. Cl.[7] .............................................. G11C 16/04

(52) U.S. Cl. ............................ 365/189.07; 365/189.09; 365/185.2; 365/185.21; 365/65; 365/200; 365/210

(58) Field of Search ...................... 365/189.07, 189.09, 365/185.2, 185.21, 65, 200, 210

(56) References Cited

FOREIGN PATENT DOCUMENTS

| JP | 07-192476 | 7/1995 |
|----|-----------|--------|
| JP | 08-115596 | 5/1996 |
| JP | 09-171696 | 6/1997 |
| JP | 09-231775 | 9/1997 |

*Primary Examiner*—Connie C. Yoha
(74) *Attorney, Agent, or Firm*—Volentine Francos & Whitt, PLLC

(57) ABSTRACT

A semiconductor storage device includes a first signal line connected to a first reference cell, a second signal line connected to a second reference cell and a potential supply circuit having first and second states. In a first state, the potential supply circuit responds to a second control signal at a first potential level, and supplies first and second reference cells respectively with potentials corresponding to first data via a first signal line and second data via a second signal line. In a second state, the potential supply circuit responds to a second control signal at a second potential level, and supplies the first and second reference cells respectively with potentials corresponding to first data via the first signal line and first data via the second signal line. A reference potential generation circuit thus decreases imprint and fatigue of a ferroelectric film of a reference cell.

17 Claims, 6 Drawing Sheets

US 6,839,289 B2

SEMICONDUCTOR STORAGE DEVICE

BACKGROUND OF THE INVENTION

1. Field of the Invention

The present invention broadly relates to a semiconductor storage device using polarization of a ferroelectric substance. More specifically, the present invention relates to a reference potential generation circuit used in a ferroelectric memory circuit for determining a data state of a memory cell comprising one transistor and one ferroelectric capacitor.

2. Description of the Background Art

The semiconductor storage device using a ferroelectric capacitor is a storage device that uses spontaneous polarization characteristics attributed to a ferroelectric substance used as a capacity insulating film of the capacitor. Accordingly, there is an advantage of eliminating the need for a refresh operation needed for DRAM (Dynamic Random Access Memory) as a conventional semiconductor storage device. Another advantage is to prevent data stored in a memory cell from being lost independently of a power supply state.

A memory cell using the ferroelectric substance comprises one MOS (Metal Oxide Semiconductor) transistor and one ferroelectric capacitor (1T/1C). This configuration has been conventionally employed for DRAM. As another configuration, such memory cell comprises two MOS transistors and two ferroelectric capacitors (2T/2C). Since there is an increasing need for miniaturization and large-scale integration of semiconductor devices in recent years, particular attention is paid to memory cells having the 1T/1C structure as the memory cell configuration.

A semiconductor storage device using a ferroelectric memory cell having the 1T/1C structure decreases an area required for each cell and is appropriate for large-scale integration. When data is read from a memory cell, However, such semiconductor storage device requires a reference potential for amplifying a signal of the memory cell. Namely, it is necessary to provide a reference potential generation circuit for generating the reference potential.

For example, a conventional reference potential generation circuit is depicted in FIG. 6.

FIG. 6 shows a conventional example. The conventional reference potential generation circuit comprises a pair of a bit line BL and a bit complementation line BLb; reference cells RMC0 through RMC3 respectively connected to the bit line BL or the bit complementation line BLb; a reference word line RWL; a reference plate line RPL; a reference write signal line RWSL0 connected to a fixed potential; and a reference write signal line RWSL1 supplied with a power supply potential Vdd.

Each of reference cells RMC0 through RMC3 is arranged at an intersecting point between each bit line and reference word line.

Of the reference cells RMC0 through RMC3, the reference cells RMC0 and RMC2 are connected to bit lines BL0 and BL1, respectively. The reference cells RMC0 and RMC2 respectively comprise selection transistors RT0 and RT2 operated by a reference word line RWL1; and ferroelectric capacitors H0 and H2 in each of which one terminal is connected to the selection transistor RT0 or RT2 and the other terminal is connected to the reference plate line RPL. The reference cells RMC1 and RMC3 are connected to bit complementation lines BLb0 and BLb1, respectively. The reference cells RMC1 and RMC3 respectively comprise selection transistors RT1 and RT3 operated by a reference word line RWL0; and ferroelectric capacitors H1 and H3 in each of which one terminal is connected to the selection transistor RT1 or RT3 and the other terminal is connected to the reference plate line RPL.

The reference cells RMC0 through RMC3 are connected to the reference write signal line RWSL0 connected to a ground potential Vss or the reference write signal line RWSL1 connected to the power supply potential Vdd via switch transistors T0 through T3.

A switch transistor T4 is connected between two bit lines BL to which the reference cells RMC1 and RMC3 are connected. A switch transistor T5 is connected between two bit complementation lines BLb to which the reference cells RMC0 and RMC2 are connected. The switch transistors T4 and T5 operate on bit line equalization signals EQ0 and EQ1, respectively.

In addition to the above-mentioned reference potential generation circuit, the semiconductor storage device having the conventional 1T/1C structure further comprises a reference control circuit to generate a control signal for the reference potential generation circuit and a sense amp circuit SA having word lines WL0 and WL1 and a plate line PL. The sense amp circuit SA is connected between one bit line BL and one bit complementation line BLb. These lines connect with a specified set of the reference cells RMC0 through RMC3 and a specified set of the memory cells MC0 through MC3. The sense amp circuit SA compares potentials generated on the respective bit lines with each other and amplifies a memory cell signal.

The following describes a read operation in the semiconductor storage device having the conventional 1T/1C structure. Here, power supply potential Vdd is assumed to be first data (data 1) and ground potential Vss is assumed to be second data (data 0). The example below explains an operation to read data from MC0 where data 1 is written.

When data is read from MC0 connected to the bit line BL0, the reference cells RMC1 and RMC3 are connected to the bit complementation line BLb0 supplied with the reference potential and to the bit complementation line BLb1 connected via BL0 and the switch transistor T4. For example, data 1 is already written to RMC1 via the reference write signal line RWSL1. Data 0 is already written to RMC3 via the reference write signal line RWSL0.

For the memory cell block containing MC0, a block selection signal goes active. In response to this block selection signal, the reference control circuit is activated.

The word line WL0 goes active and then the plate line PL0 goes active to select the memory cell MC0 connected to these lines. A potential corresponding to the data written in MC0 is applied to BL0. At the same time, the reference word line RWL0 and the reference plate line RPL go active. Since RMC1 and RMC3 are connected to these lines, a potential corresponding to data 1 written in RMC1 is applied to BLb0 and a potential corresponding to data 0 written in RMC3 is applied to BLb1.

Thereafter, the bit line equalization signal EQ0 is activated to operate the switch transistor T4 and connect BLb0 with BLb1. That is, BLb0 and BLb1 are short-circuited. Since the bit complementation lines BLb0 and BLb1 have almost the same capacity, the potential for each of BLb0 and BLb1 becomes an intermediate between potentials given to these bit complementation lines before the short circuit. This intermediate potential becomes the reference potential used to read data from the memory cell MC0.

After generating the reference potential on BLb0 in this manner, the reference control circuit inactivates EQ0 to disconnect BLb0 from BLb1. At the same time, the reference control circuit activates a sense amp circuit SA000. The sense amp circuit SA000 then amplifies the potential appearing on BL0 and corresponding to data 1 stored in MC0 and the reference potential appearing on BLb0. These amplified potentials are output as data to a digit line DB and a digit complementation line DBb.

In the conventional reference potential generation circuit, However, ferroelectric memory is used not only for a memory cell that stores data, but also for the reference cell that generates the reference potential. Moreover, the circuit is configured to always write the same data such as data 1->data 1->data 1-> . . . (data 0->data 0->data 0-> . . . ) in one reference cell. When data is repeatedly read from the memory cell, the polarization is always caused in the same direction on a ferroelectric film of a ferroelectric capacitor in the reference cell that generates the reference potential. As a result, there has been a problem of causing an imprint to deteriorate a polarization state of the ferroelectric film.

Furthermore, the conventional reference potential generation circuit is configured to connect a plurality of reference potential generation circuits to a single reference cell. Accordingly, when a block containing a memory cell to be selected is selected, data is written also to the reference cell connected to an inactive sense amp circuit.

Namely, the conventional reference cell for generating a reference potential is accessed more frequently than a memory cell where data is written and read. As a result, fatigue of the ferroelectric film is accelerated.

SUMMARY OF THE INVENTION

It is therefore an object of the present invention to provide a reference potential generation circuit that decreases an imprint and fatigue of a ferroelectric film for the reference cell by maintaining miniaturization and large-scale integration of semiconductor storage devices. It is another object of the present invention to provide a semiconductor storage device that decreases failures of a semiconductor storage device using a ferroelectric capacitor and ensures higher reliability by preventing deterioration of the ferroelectric film for the reference cell.

To solve the above-mentioned problems, a first semiconductor storage device according to the present invention comprises: a first bit line; a memory cell that is connected to the first bit line and stores data; a second bit line; a first reference cell that is connected to the second bit line and holds a potential corresponding to specified data; a first signal line that is connected to the first reference cell and supplies a potential held in the first reference cell; a third bit line; a second reference cell that is connected to the third bit line and holds a potential corresponding to specified data; a second signal line that is connected to the second reference cell and supplies a potential held in the second reference cell; a switch circuit that is connected between the second bit line and the third bit line and electrically connects the second bit line with the third bit line in response to a first control signal; a potential supply circuit having first and second states: wherein, in the first state, the potential supply circuit responds to a second control signal at a first potential level, supplies the first reference cell with a potential corresponding to first data via the first signal line, and supplies the second reference cell with a potential corresponding to second data via the second signal line; and wherein, in the second state, the potential supply circuit responds to the second control signal at a second potential level, supplies the first reference cell with a potential corresponding to the first data via the first signal line, and supplies the second reference cell with a potential corresponding to the first data via the second signal line; and a data read circuit that is connected to either the second bit line or the third bit line and the first bit line and compares a potential generated on the second bit line or the third bit line with a potential generated on the first bit line.

Further, a second semiconductor storage device according to the present invention comprises: a first bit line; a memory cell comprising a first ferroelectric capacitor and a first transistor that is provided between the first bit line and one electrode of the ferroelectric capacitor, operates on a first control signal, and reads stored data; a second bit line; a first reference cell that is connected to the second bit line and holds a potential corresponding to specified data; a first signal line that is connected to the first reference cell and supplies a potential held in the first reference cell; a second transistor that is connected between the first reference cell and the first signal line, operates on the first control signal, and writes data to the first reference cell; a third bit line; a second reference cell that is connected to the third bit line and holds a potential corresponding to specified data; a second signal line that is connected to the second reference cell and supplies a potential held in the second reference cell; a third transistor that is connected between the second reference cell and the second signal line, operates on the first control signal, and writes data to the second reference cell; a switch circuit that is connected between the second bit line and the third bit line and electrically connects the second bit line with the third bit line in response to a first control signal; and a data read circuit that is connected to either the second bit line or the third bit line and the first bit line and compares a potential generated on the second bit line or the third bit line with a potential generated on the first bit line.

In addition, a third semiconductor storage device according to the present invention comprises: a plurality of first bit lines; a plurality of memory cells that are connected to each of the plurality of first bit lines and store data; a plurality of second bit lines; a plurality of first reference cells that are connected to each of the plurality of the second bit lines and hold potentials corresponding to specified data; a first signal line that is connected to the plurality of the first reference cells and supplies a potential held in the plurality of the first reference cells; a first transistor that is connected between the first reference cell and the first signal line, operates on the first control signal, and writes data to the first reference cell; a plurality of third bit lines; a second reference cell that is connected to each of the plurality of the third bit lines and holds a potential corresponding to specified data; a second signal line that is connected to the plurality of the second reference cells and supplies a potential held in the plurality of the second reference cells; a second transistor that is connected between the second reference cell and the second signal line, operates on the first control signal, and writes data to the second reference cell; a plurality of switch circuits that is connected between the second bit line and the third bit line and electrically connects the second bit line with the third bit line in response to a first control signal; and a plurality of data read circuits that is connected to either the second bit line or the third bit line and the first bit line and compares a potential generated on the second bit line or the third bit line with a potential generated on the first bit line, wherein the first and second transistors operate when connected to the reference cells corresponding to selected ones of the plurality of the memory cells; and the first and second transistors do not operate when connected to the reference cells corresponding to unselected ones of the plurality of the memory cells.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

The first embodiment of the present invention will be described in further detail with reference to the accompanying drawings.

Figure 1:
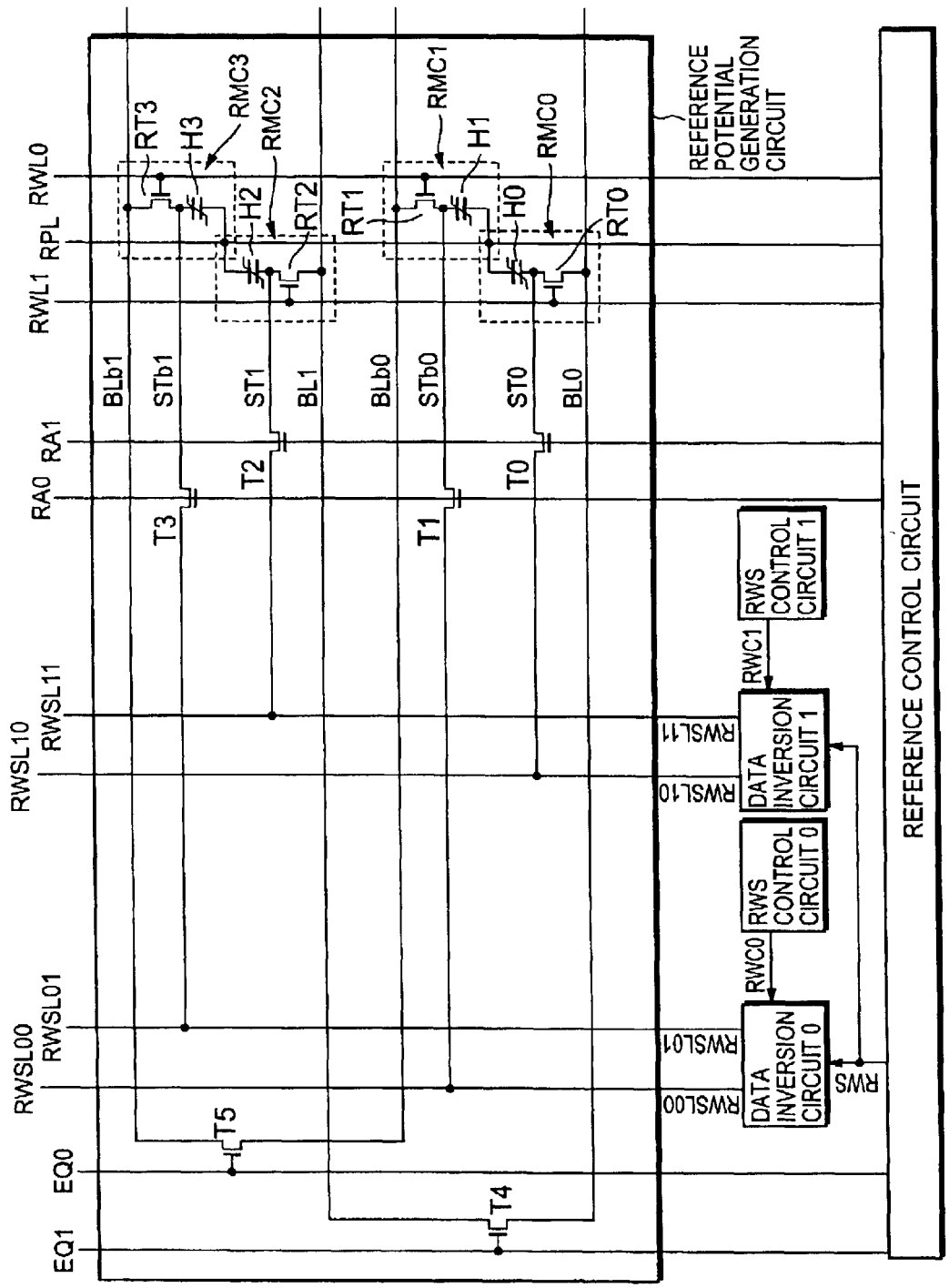
FIG. 1 is a partial circuit diagram of a semiconductor storage device according to a first embodiment of the present invention.

FIG. 1 shows a reference potential generation circuit in the semiconductor storage device according to the first embodiment and some of peripheral circuits.

Figure 6:
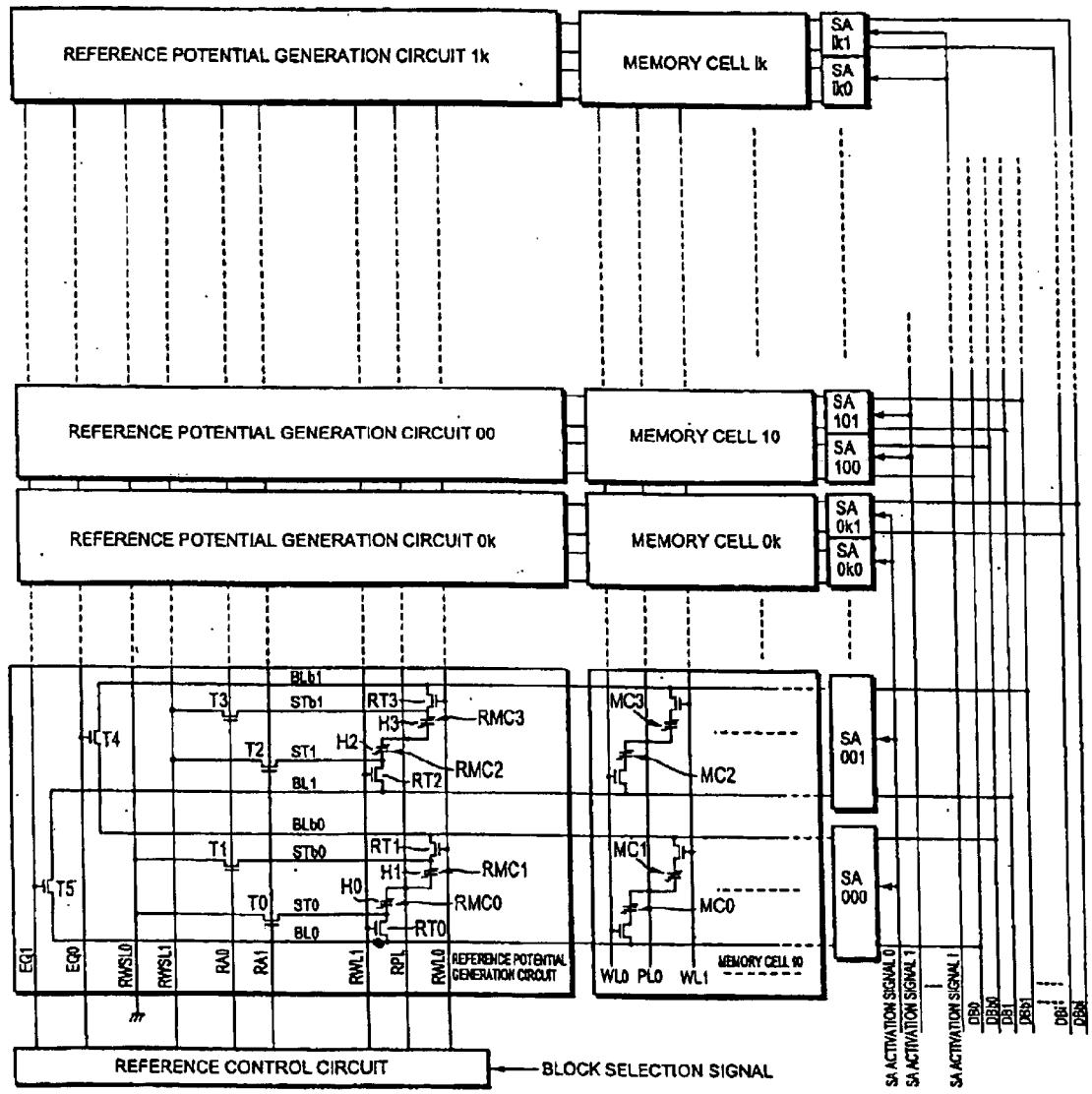
FIG. 6 is a partial circuit diagram of a conventional semiconductor storage device.

In addition to the reference potential generation circuit as shown in FIG. 1, the semiconductor storage device according to the first embodiment includes a peripheral circuit comprising a reference control circuit to generate a control signal for the reference potential generation circuit, a data inversion circuit as a potential supply circuit connected to a reference cell write signal line RWSL, and an RWS control circuit to generate signals RWC0 and RWC1 supplied to the data inversion circuit. The semiconductor storage device also includes memory cells MC0 through MC3 that are arranged at intersecting points between the bit line BL, the bit complementation line BLb, and word lines WL0 and WL1. Furthermore, the semiconductor storage device includes a sense amp circuit SA (data read circuit). The sense amp circuit SA is connected between the bit line BL connecting with any of memory cells MC0 through MC3 and the bit complementation line BLb connecting with the corresponding reference cell. The sense amp circuit SA amplifies a memory cell signal by comparing potentials generated on each bit line BL and BLb. The memory cells MC0 through MC3, including bit lines BL and BLb, and word lines WL0 and WL1, and also sense amp circuit SA, are configured as in FIG. 6 as noted above, and thus are not shown in FIG. 1. In this embodiment, inverted data is supplied to RWSL00/RWSL01 and RWSL10/RWSL11 which are provided with a data inversion circuit 0 and an RWS control circuit 0, and a data inversion circuit 1 and an RWS control circuit 1, respectively.

The reference potential generation circuit according to the first embodiment is provided with a pair of the bit line BL and the bit complementation line BLb each connecting with a memory cell, a reference word line RWL, a reference plate line RPL, and a reference write potential line RWSL connected to the data inversion circuit. The reference cells RMC0 through RMC3 are arranged at intersecting points between each bit line and reference word line.

Of the reference cells RMC0 through RMC3, the reference cells RMC0 and RMC2 are connected to the bit lines BL and comprise selection transistors RT0 and RT2 and ferroelectric capacitors H0 and H2, respectively. The reference cells RMC0 and RMC2 are operated by a reference word line RWL1. One terminal of the ferroelectric capacitor H0 is connected to the selection transistor RT0 and the other terminal thereof is connected to the reference plate line RPL. One terminal of the ferroelectric capacitor H2 is connected to the selection transistor RT2 and the other terminal thereof is connected to the reference plate line RPL. The reference cells RMC1 and RMC3 are connected to the bit complementation lines BLb and comprise selection transistors RT1 and RT3 and ferroelectric capacitors H1 and H3, respectively. The selection transistors RT1 and RT3 are operated by a reference word line RWL0. One terminal of the ferroelectric capacitor H1 is connected to the selection transistor RT1 and the other terminal thereof is connected to the reference plate line RPL. One terminal of the ferroelectric capacitor H3 is connected to the selection transistor RT3 and the other terminal thereof is connected to the reference plate line RPL.

The reference cells RMC0 and RMC3 are connected to reference write signal lines RWSL10 and RWSL01 that are connected to a ground potential Vss or a power supply potential Vdd via switch transistors T0 through T3.

A switch transistor T4 is connected between two bit lines BL connecting with the reference cells RMC0 and RMC2. A switch transistor T5 is connected between two bit complementation lines BLb connecting with the reference cells RMC1 and RMC3. The switch transistors T4 and T5 operate on bit line equalization signals EQ0 and EQ1, respectively.

Figure 2:
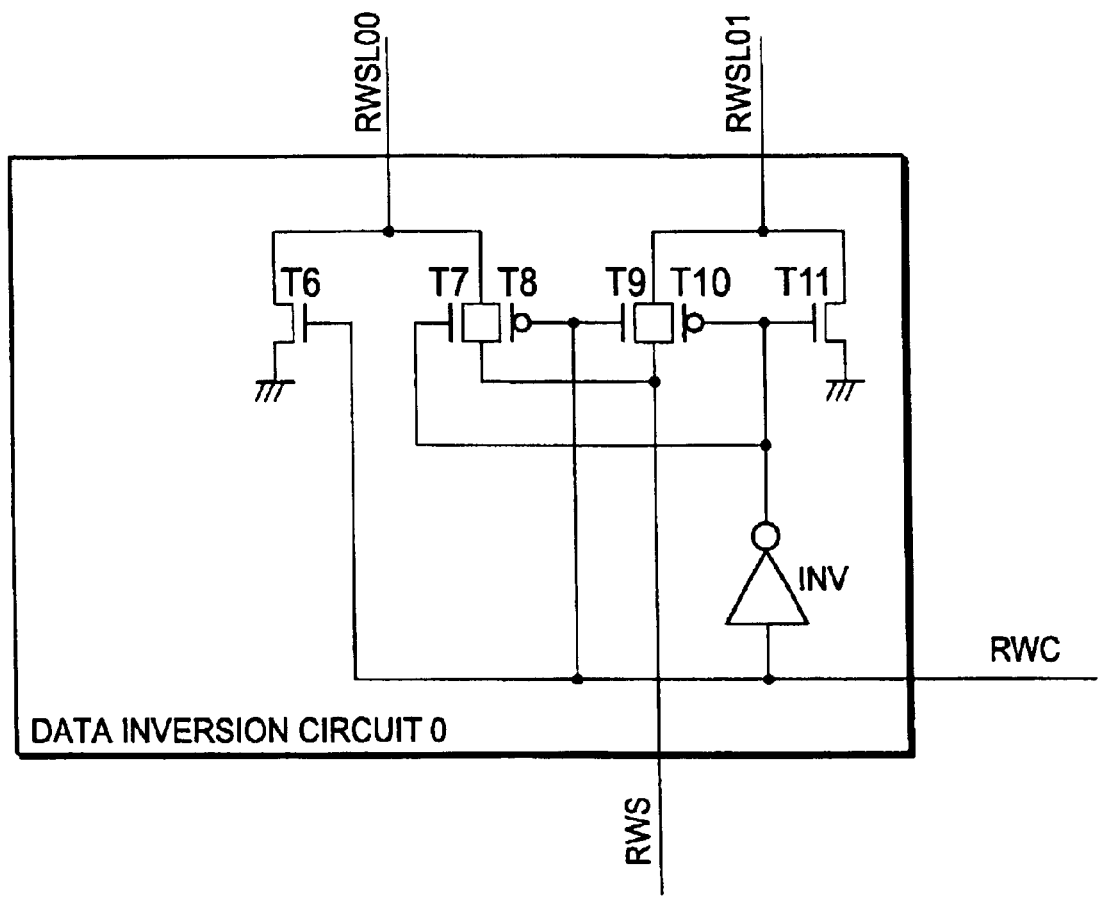
FIG. 2 is a circuit diagram showing an example of a data inversion circuit according to the first embodiment of the present invention.

The data inversion circuit according to the embodiment comprises a circuit as shown in FIG. 2. The following explains a data inversion circuit 0 as an example according to the embodiment.

Each data inversion circuit includes N-channel transistors T7 and T9, and P-channel transistors T8 and T10 that connect a signal RWS for writing data 1 to the reference cell with RWSL00 or RWSL01 connected to the reference cell where data 1 is written. Further, each data inversion circuit comprises N-channel transistors T6 and T11 that connect the ground potential Vss with RWSL00 or RWSL01 connected to the reference cell where data 0 is written. Moreover, this data inversion circuit 0 has an inverter INV that inverts a signal RWC supplied from the RWS control circuit 0 to the data inversion circuit 0.

Of the transistors constituting the data inversion circuit 0, an RWC signal controls the N-channel transistors T6 and T9 and the P-channel transistor T8. An RWC inversion signal inverted by the inverter INV controls the N-channel transistors T7 and T11 and the P-channel transistor T10. Namely, when RWC maintains the H level, the N-channel transistors T6 and T9 and the P-channel transistor T10 turn on to output Vss to RWSL00 and RWS to RWSL01. On the contrary, when RWC maintains the L level, the N-channel transistors T7 and T111 and the P-channel transistor T8 turn on to output RWS to RWSL00 and Vss to RWSL01.

In this manner, the data inversion circuit according to the embodiment changes the signal RWC supplied to the data inversion circuit and thereby changes a potential of the data reference cell write signal line RWSL, allowing appropriately inverted data to be written to the reference cell.

Figure 3:
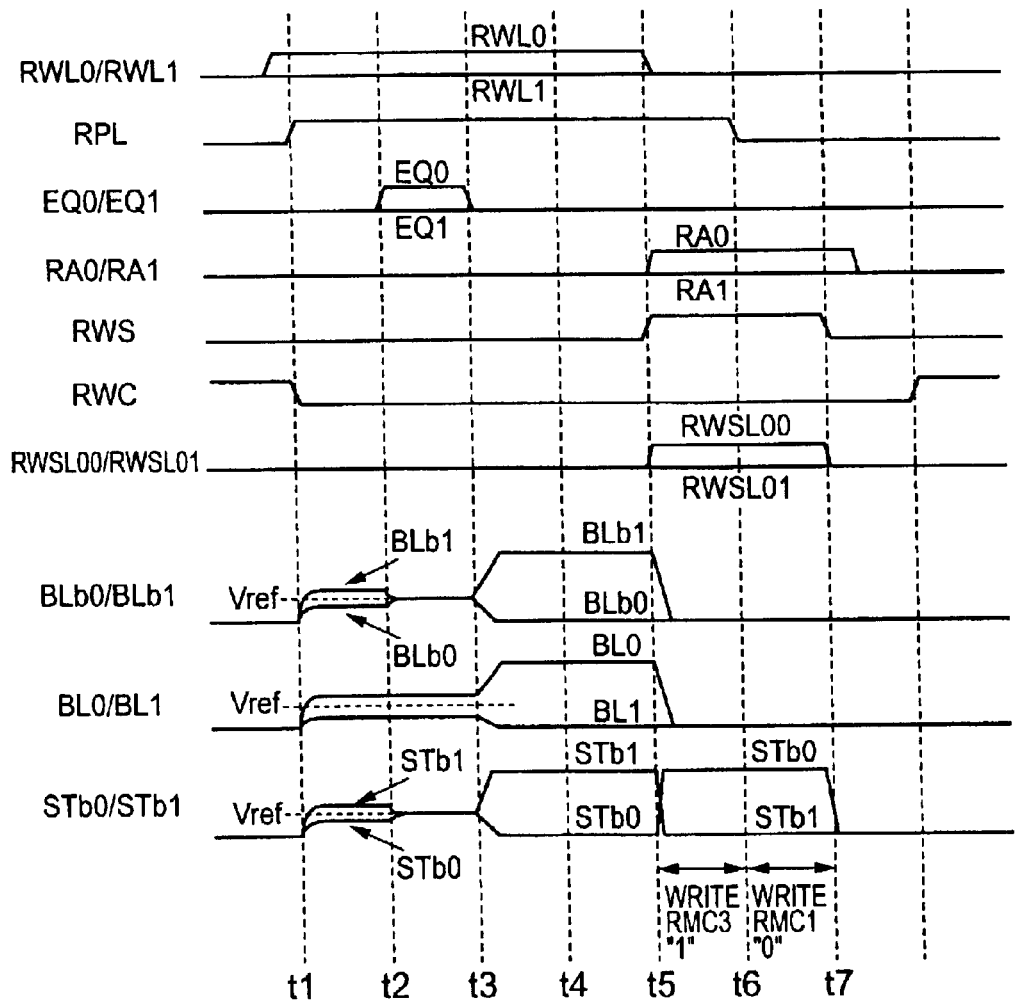
FIG. 3 is a timing chart showing operations of the semiconductor storage device according to the first embodiment of the present invention.

Referring now to FIG. 3, the following describes operations of the reference potential generation circuit to generate a reference potential used for reading data from the memory cell MC0 connected to bit line BL0 (corresponding the first bit line) in the semiconductor storage device according to the embodiment.

The following description assumes that data 0 is previously written to a reference cell RMC1 (corresponding to the first reference cell); data 1 is previously written to a reference cell RMC3 (corresponding to the second reference cell); and RWL0, RA0, and EQ0 are selected.

At time t1, RWL0 and RPL go to the high level (hereafter referred to as "H") to select RMC1 and RMC3 and then output potentials corresponding to data stored in the respective reference cells to the bit complementation lines BLb0 and BLb1. At this time, RWC0 goes to the low level (hereafter referred to as "L") to turn on transistors T7, T8, and T11 constituting the data inversion circuit 0 and turn off T6, T9, and T10, thus connecting RWSL00 with RWS and RWSL01 with Vss.

When EQ0 goes to H at time t2, the switch transistor T5 turns on to make connection between the adjacent bit complementation lines BLb0 and BLb1. This allows the bit complementation lines BLb0 and BLb1 to generate reference potentials corresponding to data stored in the respective memory cells. Since the bit complementation lines BLb0 and BLb1 have almost the same capacity, the reference potential applied to each of BLb0 and BLb1 becomes an intermediate, i.e., approximately a half of the potential given to each bit complementation line before the short circuit. This intermediate potential becomes the reference potential used to read data from the memory cell MC0.

This intermediate potential is used as the reference potential for reading data from a memory cell.

At time t3, the operation activates the sense amp circuits SA connected between BL0 and BLb0 and between BL1 and BLb1. The operation compares the reference potential for the bit complementation line BLb0 or BLb1 with a potential occurring on the bit line BL0 or BL1 pairing with the bit complementation line and corresponding to data stored in the memory cell MC0 or MC2, and then amplifies a memory cell signal. The amplified signal is output to corresponding digit lines DB and DBb to complete the operation to read data from the selected memory cell.

After completion of the read operation, preparations are made for generating a reference potential needed to read the next data. Namely, data is rewritten to the reference cells RMC0 and RMC3 from which the stored data was read during the previous read operation.

At time t5, RWS goes to H to supply RWSL00 connected to RWS with a potential corresponding to data 1. At this time, RWSL01 is connected to the ground potential Vss via the data inversion circuit 0. Therefore, RWSL01 is given an potential corresponding to data 0. Namely, at time t5, the operation inverts data to be rewritten to the reference cells RMC1 and RMC3.

Concurrently at time t5, a control signal RA0 goes to H to turn on the switch transistors T1 and T3, and then make connection between the reference write signal line RWSL01 supplied with the potential corresponding to data 0 and the reference cell RMC3 to rewrite data 0 to RMC3.

Then, at time t6, RPL goes to L to rewrite data 1 to the reference cell RMC1.

At time t7, RWS goes to L to let STb0 and STb1 go to L. Thereafter, RA0 goes to L. The switch transistors T1 and T3 disconnect RMC1 from RWSL00, and RMC3 from RWSL01.

Thus, data has been rewritten to the reference cells RMC1 and RMC3.

The above-mentioned example explains rewriting data to RMC1 according to the sequence of data 0->data 1 and to RMC3 according to the sequence of data 1->data 0. When RWC is changed to H from L, the transistors T6, T9, and T10 in the data inversion circuit 0 turn on and the transistors T7, T8, and T11 turn off. Consequently, RWSL00 is connected to the ground potential Vss and RWSL01 is connected to RWS. As a result, data 0 is written to RMC1 and data 1 is written to RMC3.

It may be preferable to write data of the same potential for the specified number of times like data 0->data 0-> . . . ->data 1-> . . . written to RMC1 and data 1->data 1-> . . . ->data 0-> . . . written to RMC3. Thereafter, data may be inverted and written to the reference cell.

As mentioned above, the semiconductor storage device having the reference potential generation circuit according to the first embodiment arranges the data inversion circuit and its control circuit connected to the reference cell write signal line RWSL included in the reference potential generation circuit. This makes it possible to freely control writing of data to a single reference cell in such a manner as data 0->data 1->data 0->data 1-> . . . or data 0->data 0->data 1->data 1->data 0-> and so on. Namely, it becomes possible to perform a write operation suited for characteristics of the ferroelectric capacitor in the reference cell. As a result, it becomes possible to suppress fatigue of the reference cell's ferroelectric capacitor that is accessed more often than a memory cell. Accordingly, it is possible to prevent occurrence of an imprint that degrades the polarization state of a ferroelectric film.

In addition, the embodiment provides one data inversion circuit and its control circuit to a pair of lines RWSL connecting with a plurality of reference potential generation circuits, thus enabling the control of writing to all reference cells connected to the RWSL pair. That is, the reference potential generation circuit according to the embodiment can prevent an imprint from occurring on the ferroelectric film in the reference cell with little increase in the required area.

Further, the semiconductor storage device includes a plurality of reference potential generation circuits controlled by one reference cell control circuit and a plurality of blocks comprising a plurality of memory cells that read data by using reference potentials generated from these reference potential generation circuits. When the semiconductor storage device uses, for example, a write signal WE or the like to write data to a memory cell included in one block, this write signal WE can be also used to rewrite data to the reference cell included in an adjacent block. Since a write signal to a memory cell is designed to be used as a rewrite signal to the reference cell in an adjacent block, data can be rewritten to the reference cell without needing for special timing adjustment.

The second embodiment of the present invention will now be described.

Figure 4:
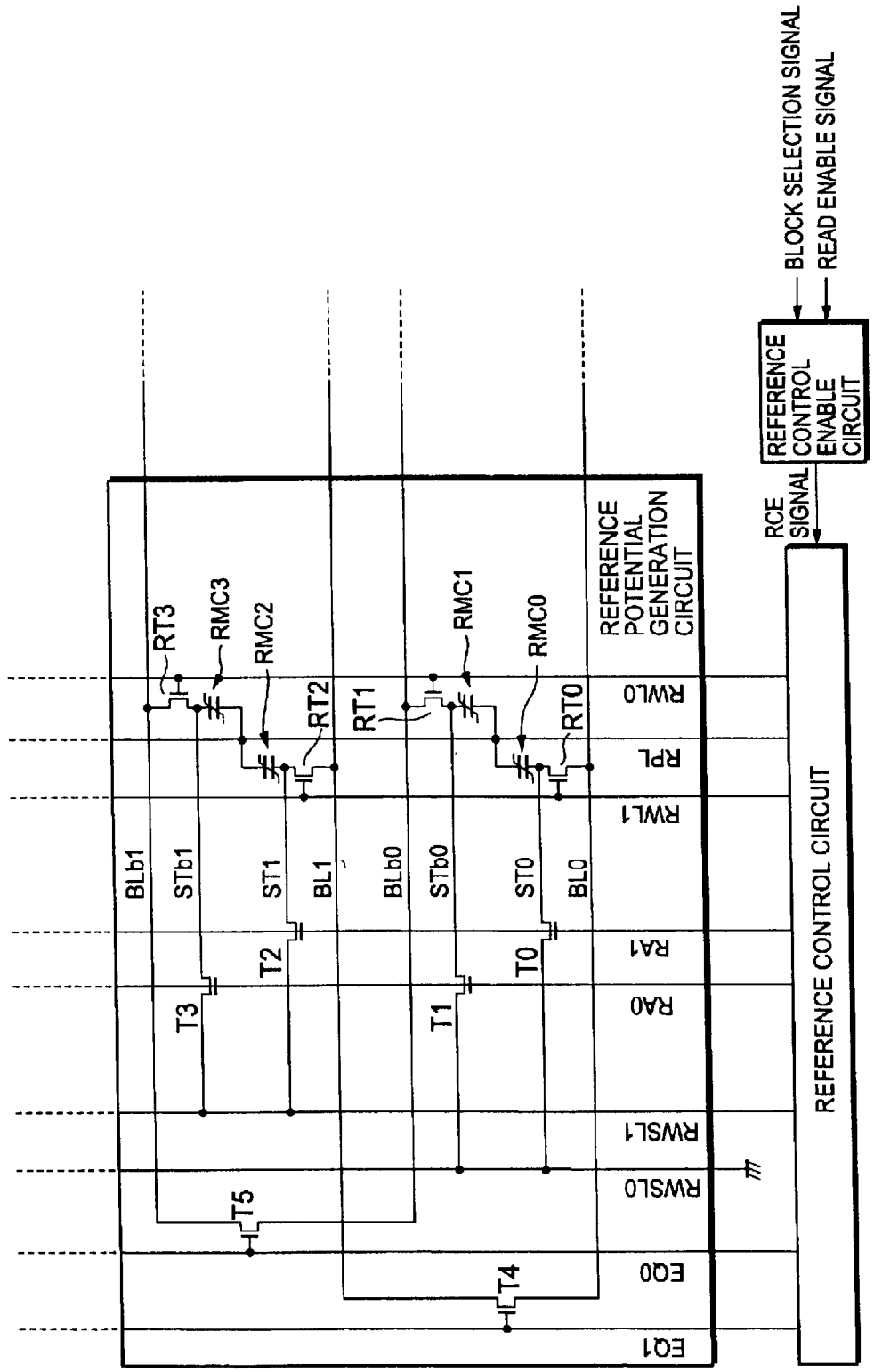
FIG. 4 is a partial circuit diagram of a semiconductor storage device according to a second embodiment of the present invention.

FIG. 4 diagrams the reference potential generation circuit and its peripheral circuit in the semiconductor device according to the second embodiment. The same reference symbols as those used in the first embodiment correspond to the same or equivalent parts.

Similarly to the above-mentioned first embodiment, the semiconductor storage device according to the second embodiment includes the peripheral circuit comprising the reference potential generation circuit and the reference control circuit to generate a control signal for the reference potential generation circuit; the memory cells MC0 through MC3 that are arranged at intersecting points between the bit line BL, the bit complementation line BLb, and word lines WL0 and WL1; and the sense amp circuit SA that is connected between the bit line BL and the bit complementation line BLb and amplifies a memory cell signal. The semiconductor storage device further comprises a reference control enable circuit that receives a block selection signal BE and a read signal RE to generate a control signal RCE for the reference potential generation circuit.

The semiconductor storage device according to the second embodiment reads and writes data to memory cells in the same manner as the conventional semiconductor storage device.

However, the reference control enable circuit is connected to the reference control circuit in the second embodiment unlike the conventional semiconductor storage device that uses the block selection signal BE as a control signal for the reference potential generation circuit. The second embodiment receives the block selection signal BE and the read signal RE to generate a signal RCE that is used as a control signal for the reference potential generation circuit.

The conventional semiconductor storage device uses only the block selection signal BE as a control signal for the reference potential generation circuit. Accordingly, the reference potential generation circuit is activated not only during an operation to read data from the memory cell that requires a reference potential, but also during an operation to write data thereto. Data is written to the reference cell each time a block is selected.

On the other hand, the semiconductor storage device according to the second embodiment receives the block selection signal BE and the read signal RE to generate the signal RCE that is used as a control signal for the reference potential generation circuit. This enables an access and a rewrite operation to the reference cell when data is read from a memory cell that requires a reference potential to be generated. It is possible to perform no operation for the reference cell when data is written to a memory cell that originally requires no reference potential to be generated.

That is, the second embodiment uses the block selection signal BE and the read signal RE to generate a signal to activate the reference control circuit. The second embodiment thus disables an access and a rewrite operation to the reference cell when data is written to a memory cell, making it possible to decrease fatigue of the ferroelectric film in the reference cell.

Further, in order to prevent deterioration of the ferroelectric film in the reference cell due to an imprint, it is also possible to provide the semiconductor storage device according to the second embodiment with the above-mentioned data inversion circuit.

Finally, the third embodiment of the present invention will now be described.

Figure 5:
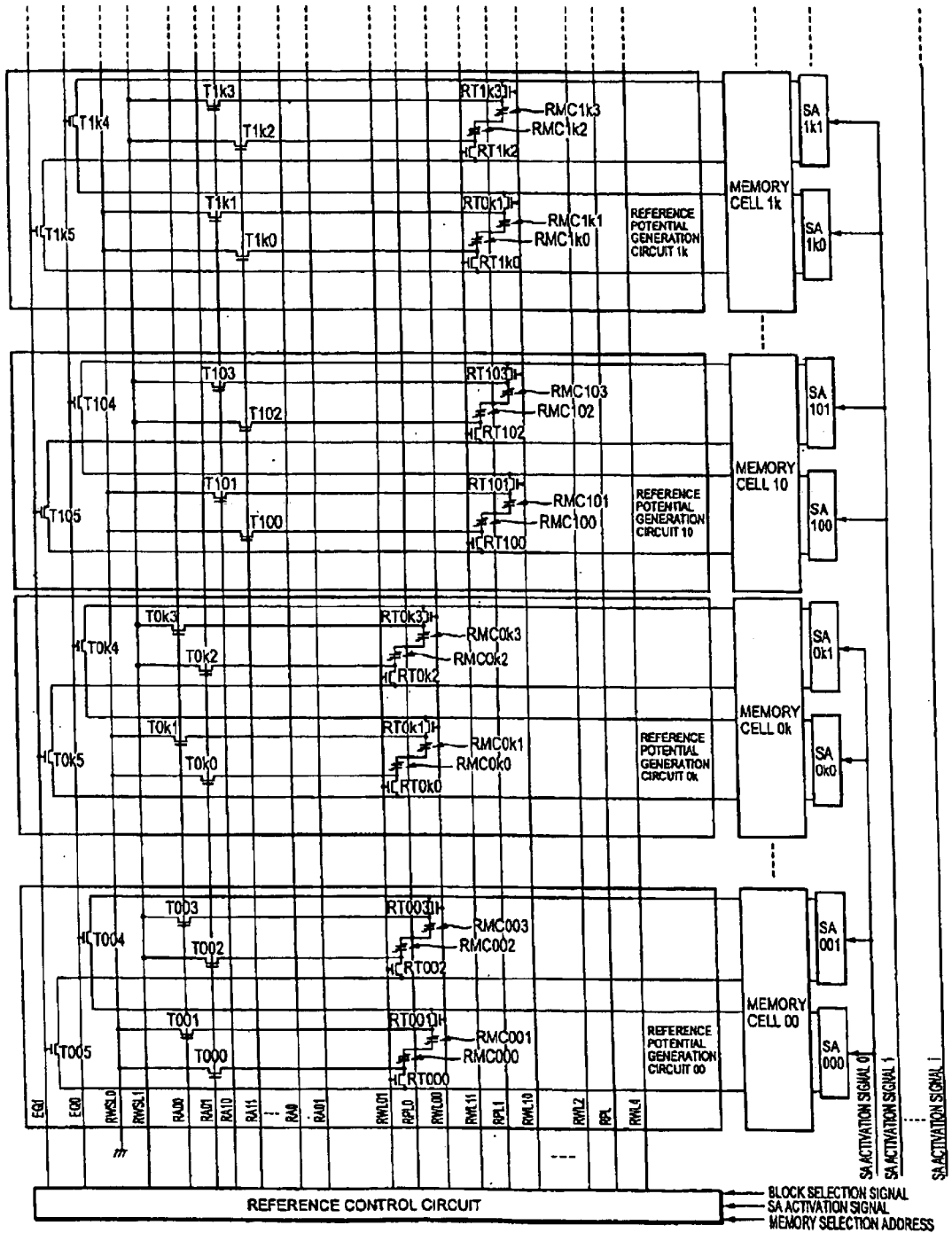
FIG. 5 is a partial circuit diagram of a semiconductor storage device according to a third embodiment of the present invention.

FIG. 5 diagrams the reference potential generation circuit and its peripheral circuit in the semiconductor device according to the third embodiment. The same reference symbols as those used in the first embodiment correspond to the same or equivalent parts.

Similarly to the above-mentioned first embodiment, the semiconductor storage device according to the third embodiment includes the peripheral circuit comprising the reference potential generation circuit and the reference control circuit to generate a control signal for the reference potential generation circuit; the memory cells MC0 through MC3 that are arranged at intersecting points between the bit line BL, the bit complementation line BLb, and word lines WL0 and WL1; and the sense amp circuit SA that is connected between the bit line BL and the bit complementation line BLb and amplifies a memory cell signal.

A plurality of reference potential generation circuits 00 through 1k and a plurality of memory cells 00 through 1k are connected to a pair of reference write signal lines RWSL connected to one reference control circuit. A plurality of sense amp circuits SA000 through SA0k1 and SA100 through SA1k1 is connected between the bit line BL and the bit complementation line BLb included in these reference potential generation circuits and memory cells.

The semiconductor storage device according to the third embodiment further includes SA activation signals 0 through i for activating the sense amp circuit SA that corresponds to each unit (block) to read data based on an external input address.

The following describes an operation to rewrite data to the reference cell of the reference potential generation circuit according to the third embodiment in a case, for example, where memory cells 00 through 0k are selected in accordance with externally input addresses.

When the memory cells 00 through 0k are selected, an SA activation signal 0 goes active to activate SA000 through SA0k1. At this time, based on the block selection signal BE, the SA activation signal, and a memory selection address, the reference control circuit selects RPL0 out of RPL0 through RPLi. In addition, the reference control circuit selects either RA00 or RA01 out of RA00 through RAi1, and RWL00 or RWL01 out of RWL00 through RWLi1.

When RA00 and RWL00 are selected, RMC001, RMC003 through RMC0k1, and RMC0k3 generate a reference potential.

At this time, only RA00 becomes active out of RA00 through RAi1. Accordingly, an access is made to such reference cells as RMC001, RMC003 through RMC0k1, and RMC0k3. The switch transistors T001, T003 through T0k1, and T0k3 perform an operation to rewrite data to the corresponding reference cells.

Likewise, when the memory cells 10 through 1k are selected, an SA activation signal 1 goes active to activate SA100 through SA1k1. At this time, based on the block selection signal BE, the SA activation signal, and a memory selection address, the reference control circuit selects RPL1 out of RPL0 through RPLi. In addition, the reference control circuit selects either RA10 or RA11 out of RA00 through RAi1, and RWL10 or RWL11 out of RWL00 through RWLi1.

When RA11 and RWL11 are selected, RMC100, RMC102 through RMC1k0, and RMC1k2 generate a reference potential.

At this time, only RA11 becomes active out of RA00 through RAi1. Accordingly, an access is made to such reference cells as RMC100, RMC102 through RMC1k0, and RMC1k2. The switch transistors T100, T102 through T1k0, and T1k2 perform an operation to rewrite data to the corresponding reference cells.

As mentioned above, the semiconductor storage device having the reference potential generation circuit according to the third embodiment classifies enable signals to operate the switch transistor T000 through T003 in the reference potential generation circuit, the reference cell selection transistors RT000 through RT003, and the reference plate line RPL into units of reading data. Further, the semiconductor storage device uses the block selection signal, the SA activation signals 0 through i, and the memory selection address to control the enable signals in the reference control circuit, preventing an access to a reference cell that need not be accessed. As a result, it becomes possible to decrease the number of rewrite operations for the reference cell and to decrease fatigue of the ferroelectric film in the reference cell.

Further, in order to prevent deterioration of the ferroelectric film in the reference cell due to an imprint, the third embodiment can also provide the semiconductor storage device according to the second embodiment with the above-mentioned data inversion circuit as mentioned above.

As mentioned above, the present invention arranges the data inversion circuit and its control circuit connected to the reference cell write signal line RWSL included in the reference potential generation circuit. Accordingly, the present invention makes it possible to freely control writing of data to a single reference cell and to perform a write operation suited for characteristics of the ferroelectric capacitor in the reference cell by maintaining miniaturization and large-scale integration of semiconductor storage devices. As a result, it becomes possible to suppress fatigue of the reference cell's ferroelectric capacitor that is accessed more often than a memory cell. Accordingly, it is possible to prevent occurrence of an imprint that degrades the polarization state of a ferroelectric film.

Further, the present invention receives the block selection signal BE and the read signal RE to generate the signal RCE that is used as a control signal for the reference potential generation circuit. This enables an access and a rewrite operation to the reference cell when data is read from a memory cell that requires a reference potential to be generated. It is possible to perform no operation for the reference cell when data is written to a memory cell that originally requires no reference potential to be generated. As a result, it is possible to disable an access and a rewrite operation to the reference cell when data is written to a memory cell, making it possible to decrease fatigue of the ferroelectric film in the reference cell.

Furthermore, the present invention classifies data into units of reading and uses the block selection signal, the SA activation signals 0 through i, and the memory selection address to control the reference control circuit. It is possible to decrease accesses to a reference cell that need not be accessed and to decrease the number of rewrite operations for the reference cell. As a result, it becomes possible decrease fatigue of the ferroelectric film in the reference cell.

What is claimed is:

1. A semiconductor storage device comprising:
   a first bit line;
   a memory cell that is connected to the first bit line and stores data;
   a second bit line;
   a first reference cell that is connected to the second bit line and holds a potential corresponding to specified data;
   a first signal line that is connected to the first reference cell and supplies the potential held in the first reference cell;
   a third bit line;
   a second reference cell that is connected to the third bit line and holds a potential corresponding to specified data;
   a second signal line that is connected to the second reference cell and supplies the potential held in the second reference cell;
   a switch circuit that is connected between the second bit line and the third bit line and electrically connects the second bit line with the third bit line in response to a first control signal;
   a potential supply circuit having first and second states wherein in the first state, the potential supply circuit responds to a second control signal at a first potential level, supplies the first reference cell with a potential corresponding to first data via the first signal line, and supplies the second reference cell with a potential corresponding to second data via the second signal line; and wherein in the second state, the potential supply circuit responds to the second control signal at a second potential level, supplies the first reference cell with the potential corresponding to the first data via the first signal line, and supplies the second reference cell with the potential corresponding to the first data via the second signal line; and
   a data read circuit that is connected to either the second bit line or the third bit line and the first bit line and compares a potential generated on the second bit line or the third bit line with a potential generated on the first bit line.

2. The semiconductor storage device according to claim 1, wherein
   the potential supply circuit comprises a first pMOS transistor in which a drain is connected to the potential corresponding to the first data and a source is connected to the first signal line; a first nMOS transistor in which a drain is connected to the potential corresponding to the first data and a source is connected to the first signal line; a second pMOS transistor in which a drain is connected to the potential corresponding to the first data and a source is connected to the second signal line; a second nMOS transistor in which a drain is connected to the potential corresponding to the first data and a source is connected to the second signal line; a third nMOS transistor in which a drain is connected to the potential corresponding to the second data and a source is connected to the first signal line; a fourth nMOS transistor in which a drain is connected to the potential corresponding to the second data and a source is connected to the second signal line; and an inverter that inverts a control signal that controls the potential supply circuit;
   the control signal operates the first pMOS transistor and the second and third nMOS transistors; and
   the control signal inverted by the inverter operates the second pMOS transistor and the first and fourth nMOS transistors.

3. The semiconductor storage device according to claim 1, wherein
   the memory cell comprises a first ferroelectric capacitor; and a first transistor provided between one electrode of the first ferroelectric capacitor and the first bit line, wherein the first transistor operates responsive to a third control signal and reads data from the memory cell;
   the first reference cell comprises a second ferroelectric capacitor; and a second transistor provided between one electrode of the second ferroelectric capacitor and the second bit line, wherein the second transistor operates responsive to a fourth control signal and reads data from the first reference cell; and
   the second reference cell comprises a third ferroelectric capacitor; and a third transistor provided between one electrode of the third ferroelectric capacitor and the third bit line, wherein the third transistor operates responsive to the fourth control signal and reads data from the second reference cell.

4. The semiconductor storage device according to claim 3, wherein the first, second, and third ferroelectric capacitors have almost the same element characteristics.

5. The semiconductor storage device according to claim 1, wherein the potential generated on the second bit line or the third bit line compared in the data read circuit with the potential generated on the first bit line is an intermediate potential between a potential applied to the second bit line from the first reference cell and a potential applied to the third bit line from the second reference cell.

6. The semiconductor storage device according to claim 1, further comprising:
a first transistor that is connected between the first reference cell and the first signal line, operates responsive to a third control signal, and writes data to the first reference cell; and
a second transistor that is connected between the second reference cell and the second signal line, operates responsive to the third control signal, and writes data to the second reference cell.

7. The semiconductor storage device according to claim 6, further comprising:
a plurality of the memory cells and a plurality of the first and second reference cells, wherein
the first and second transistors operate when connected to the reference cells corresponding to selected ones of the plurality of the memory cells; and the first and second transistors do not operate when connected to the reference cells corresponding to non-selected ones of the plurality of the memory cells.

8. The semiconductor storage device according to claim 7, further comprising:
a plurality of the data read circuits activated by different activation signals, wherein
the first and second transistors connected to reference cells corresponding to the selected memory cells operate responsive to an address selection signal to select one memory cell and an activation signal to activate the data read circuits connected to the selected memory cells.

9. A semiconductor storage device comprising:
a first bit line;
a memory cell comprising a first ferroelectric capacitor and a first transistor that is provided between the first bit line and one electrode of the ferroelectric capacitor, operates responsive to a first control signal, and reads stored data;
a second bit line;
a first reference cell that is connected to the second bit line and holds a potential corresponding to specified data;
a first signal line that is connected to the first reference cell and supplies the potential held in the first reference cell;
a second transistor that is connected between the first reference cell and the first signal line, operates responsive to the first control signal, and writes data to the first reference cell;
a third bit line;
a second reference cell that is connected to the third bit line and holds a potential corresponding to specified data;
a second signal line that is connected to the second reference cell and supplies the potential held in the second reference cell;
a third transistor that is connected between the second reference cell and the second signal line, operates responsive to the first control signal, and writes data to the second reference cell;
a switch circuit that is connected between the second bit line and the third bit line and electrically connects the second bit line with the third bit line in response to a second control signal;
a data read circuit that is connected to either the second bit line or the third bit line and the first bit line, and compares a potential generated on the second bit line or the third bit line with a potential generated on the first bit line;
a reference control circuit that generates the first and second control signals; and
a reference control enable circuit that generates a third control signal responsive to a block selection signal and a read signal, to control the reference control circuit.

10. The semiconductor storage device according to claim 9, wherein
the first reference cell comprises a second ferroelectric capacitor; and a fourth transistor provided between one electrode of the second ferroelectric capacitor and the second bit line, wherein the fourth transistor operates responsive to a fourth control signal and reads data from the first reference cell; and
the second reference cell comprises a third ferroelectric capacitor; and a fifth transistor provided between one electrode of the third ferroelectric capacitor and the third bit line, wherein the fifth transistor operates responsive to the fourth control signal and reads data from the second reference cell.

11. The semiconductor storage device according to claim 10, wherein the first, second, and third ferroelectric capacitors have almost the same element characteristics.

12. The semiconductor storage device according to claim 9 wherein the potential generated on the second bit line or the third bit line compared in the data read circuit with the potential generated on the first bit line is an intermediate potential between a potential applied to the second bit line from the first reference cell and a potential applied to the third bit line from the second reference cell.

13. A semiconductor storage device comprising:
a plurality of first bit lines;
a plurality of memory cells that are respectively connected to the plurality of first bit lines and store data;
a plurality of second bit lines;
a plurality of first reference cells that are respectively connected to the plurality of second bit lines and hold potentials corresponding to specified data;
a first signal line that is connected to the plurality of first reference cells and supplies the potentials held in the plurality of first reference cells;
a plurality of first transistors that are respectively connected between the first reference cells and the first signal line, operate responsive to a first control signal, and write data to the first reference cells;
a plurality of third bit lines;
a plurality of second reference cells that are respectively connected to the plurality of third bit lines and holds potentials corresponding to specified data;
a second signal line that is connected to the plurality of second reference cells and supplies the potentials held in the plurality of second reference cells;

a plurality of second transistors that are respectively connected between the second reference cells and the second signal line, operate responsive to the first control signal, and write data to the second reference cells;

a plurality of switch circuits that are connected between respective pairs of the second bit lines and the third bit lines and electrically connect the second bit lines with the third bit lines of the respective pairs in response to a second control signal;

a plurality of data read circuits that are connected to either respective ones of the second bit lines or the third bit lines and the first bit lines, and compare potentials generated on the second bit lines or the third bit lines with potentials generated on the first bit lines; and a reference control circuit that generates the first and second control signals responsive to a block selection signal, a data read circuit activation signal, and a memory selection address signal, wherein the first and second transistors operate when connected to the first and second reference cells corresponding to selected ones of the plurality of the memory cells, and the first and second transistors do not operate when connected to the first and second reference cells corresponding to non-selected ones of the plurality of the memory cells.

14. The semiconductor storage device according to claim 13, wherein each of the plurality of the memory cells comprises a first ferroelectric capacitor; and a third transistor provided between one electrode of the first ferroelectric capacitor and a corresponding one of the first bit lines, wherein the third transistor operates responsive to a third control signal and reads data from the memory cell;

each of the plurality of the first reference cells comprises a second ferroelectric capacitor; and a fourth transistor provided between one electrode of the second ferroelectric capacitor and a corresponding one of the second bit lines, wherein the fourth transistor operates responsive to a fourth control signal and reads data from the first reference cell; and each of the plurality of the second reference cells comprises a third ferroelectric capacitor; and a fifth transistor provided between one electrode of the third ferroelectric capacitor and a corresponding one of the third bit lines, wherein the fifth transistor operates responsive to the fourth control signal and reads data from the second reference cell.

15. The semiconductor storage device according to claim 14, wherein the first, second, and third ferroelectric capacitors have almost the same element characteristics.

16. The semiconductor storage device according to claim 13, wherein the potentials generated on the second bit lines or the third bit lines compared in the data read circuits with the potentials generated on the first bit lines are intermediate potentials between potentials applied to the second bit lines from the first reference cells and potentials applied to the third bit lines from the second reference cells.

17. The semiconductor storage device according to claim 13, wherein each of the plurality of the memory cells comprises a ferroelectric capacitor; and a third transistor provided between one electrode of the third ferroelectric capacitor and a corresponding one of the first bit lines, wherein the third transistor operates responsive to a second control signal and reads data from the memory cell.

* * * * *